(12) United States Patent
Motokawa et al.

(10) Patent No.: US 11,493,846 B2
(45) Date of Patent: Nov. 8, 2022

(54) PATTERN FORMING METHOD AND TEMPLATE MANUFACTURING METHOD

(71) Applicant: Kioxia Corporation, Tokyo (JP)

(72) Inventors: Takeharu Motokawa, Zushi Kanagawa (JP); Noriko Sakurai, Yokohama Kanagawa (JP); Ryu Komatsu, Atsugi Kanagawa (JP); Hideaki Sakurai, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 223 days.

(21) Appl. No.: 16/817,804

(22) Filed: Mar. 13, 2020

(65) Prior Publication Data

US 2021/0088906 A1 Mar. 25, 2021

(30) Foreign Application Priority Data

Sep. 19, 2019 (JP) .............................. JP2019-170879

(51) Int. Cl.
| | | |
|---|---|---|
| *G03F 7/20* | (2006.01) | |
| *G03F 7/09* | (2006.01) | |
| *G03F 9/00* | (2006.01) | |
| *G03F 7/00* | (2006.01) | |

(52) U.S. Cl.
CPC ............ *G03F 7/094* (2013.01); *G03F 7/0035* (2013.01); *G03F 9/7076* (2013.01); *G03F 9/7084* (2013.01)

(58) Field of Classification Search
CPC ...... G03F 7/094; G03F 7/0035; G03F 9/7076; G03F 9/7084; G03F 7/0002; G03F 9/708; G03F 7/40; H01L 21/0338; H01L 21/0273; H01L 21/0337; H01L 21/32139; H01L 21/0332; H01L 27/11531; H01L 27/0207; H01L 27/1157; H01L 27/11524; H01L 27/11573; H01L 27/11526; H01L 27/11575; H01L 21/3086; H01L 27/11548; G11C 5/06; G11C 16/0483

See application file for complete search history.

(56) References Cited

U.S. PATENT DOCUMENTS

| | | | |
|---|---|---|---|
| 8,431,329 | B2 | 4/2013 | Bae et al. |
| 8,551,875 | B2 | 10/2013 | Kajiwara |
| 8,679,967 | B2 | 3/2014 | Scheuerlein et al. |
| 8,741,696 | B2 | 6/2014 | Scheuerlein et al. |
| 8,759,177 | B2 | 6/2014 | Yanai et al. |
| 8,809,128 | B2 | 8/2014 | Scheuerlein et al. |
| 8,822,321 | B2 | 9/2014 | Kajiwara |

(Continued)

FOREIGN PATENT DOCUMENTS

| | | |
|---|---|---|
| JP | 2011-65136 A | 3/2011 |
| JP | 5075897 B2 | 11/2012 |

(Continued)

*Primary Examiner* — Mesfin T Asfaw
(74) *Attorney, Agent, or Firm* — Finnegan, Henderson, Farabow, Garrett & Dunner L.L.P.

(57) ABSTRACT

According to one embodiment, a pattern forming method includes forming a resist film including a first core material pattern and a second core material pattern, on a first film laminated on a substrate; forming a second film at least on sidewalls of the first and second core material patterns; removing the first core material pattern while not removing the second core material pattern and the second film; and processing the first film by using, as a mask, the second core material pattern and the second film.

14 Claims, 10 Drawing Sheets

(56) References Cited

U.S. PATENT DOCUMENTS

| | | | |
|---|---|---|---|
| 8,969,923 B2 | 3/2015 | Scheuerlein et al. | |
| 9,586,343 B2 | 3/2017 | Sakamoto et al. | |
| 2011/0076850 A1 | 3/2011 | Sumioka | |

FOREIGN PATENT DOCUMENTS

| | | | | |
|---|---|---|---|---|
| JP | 2013-508986 A | 3/2013 | | |
| JP | 5606388 B2 | 10/2014 | | |
| JP | 5659135 B2 | 1/2015 | | |
| JP | 5673900 B2 | 2/2015 | | |
| JP | 2017-28081 A | 2/2017 | | |
| JP | 6115245 B2 | 4/2017 | | |
| JP | 6127535 B2 | 5/2017 | | |
| JP | 6136721 B2 | 5/2017 | | |
| JP | 6183519 B2 | 8/2017 | | |
| JP | 6236918 B2 | 11/2017 | | |
| JP | 2018-146760 A | 9/2018 | | |
| KR | 20100019798 A | * | 2/2010 | ........ H01L 27/11526 |

\* cited by examiner

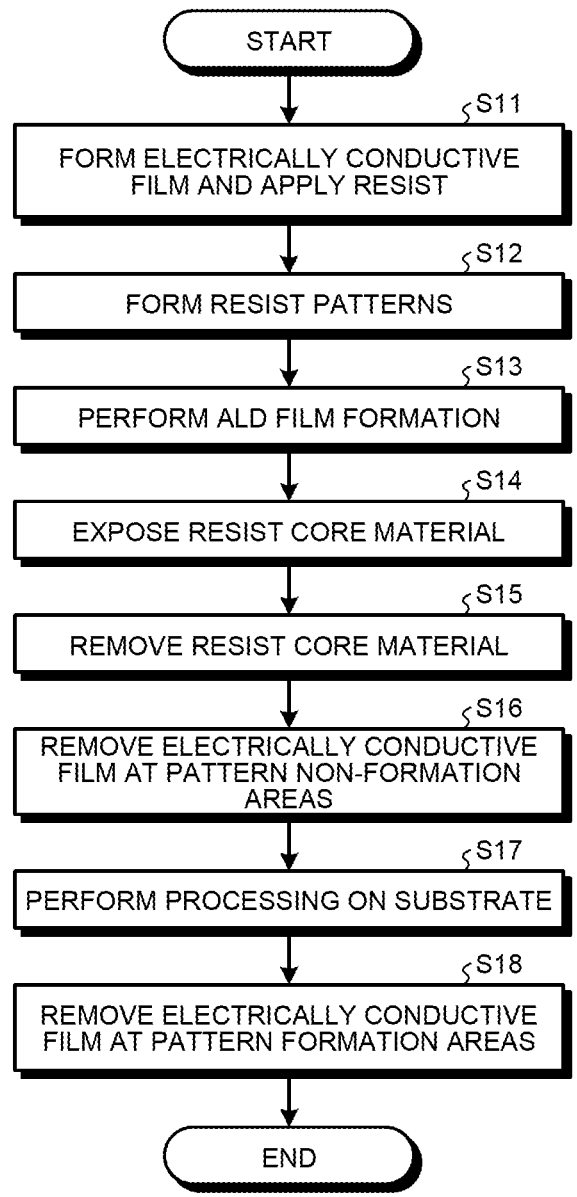

PATTERN FORMING METHOD AND TEMPLATE MANUFACTURING METHOD

CROSS-REFERENCE TO RELATED APPLICATIONS

This application is based upon and claims the benefit of priority from Japanese Application No. 2019-170879, filed on Sep. 19, 2019, the entire contents of which are incorporated herein by reference.

FIELD

Embodiments described herein relate generally to a pattern forming method and a template manufacturing method.

BACKGROUND

In the manufacturing process of semiconductor devices, an imprint method is available among fine-pattern forming methods.

By imprint method, patterns are formed by setting a template in direct contact with a resist on a substrate.

For this purpose, the template is provided with alignment marks for positional alignment with respect to the substrate, in addition to primary device patterns formed on the resist.

Conventionally, sidewall processing for transferring patterns using a sidewall mask as an etching mask may be applied to a template manufacturing method. In such a case, however, alignment marks may be subdivided (segmentation), which results in insufficient alignment signal intensity and being unable to execute alignment processing.

It is thus preferable to provide a pattern forming method and a template manufacturing method that can form device patterns and alignment marks through the same process, and can ensure sufficient alignment signal intensity without subdivisions of the alignment marks.

BRIEF DESCRIPTION OF THE DRAWINGS

FIG. 5 is a flowchart of a template manufacturing process;

DETAILED DESCRIPTION

According to one embodiment, in general, a pattern forming method includes forming a resist film including a first core material pattern and a second core material pattern, on a first film laminated on a substrate; forming a second film at least on sidewalls of the first and second core material patterns; removing the first core material pattern while not removing the second core material pattern and the second film; and processing the first film by using, as a mask, the second core material pattern and the second film.

Exemplary embodiments will be explained below in detail with reference to the accompanying drawings.

The following embodiments are merely exemplary and unintended to limit the scope of the present invention. The sectional views of a template according to the following embodiments are schematic, therefore, the relationship between layer thickness and width and/or thickness ratios between respective layers may differ from the ones in reality.

First Embodiment

Figure 1:
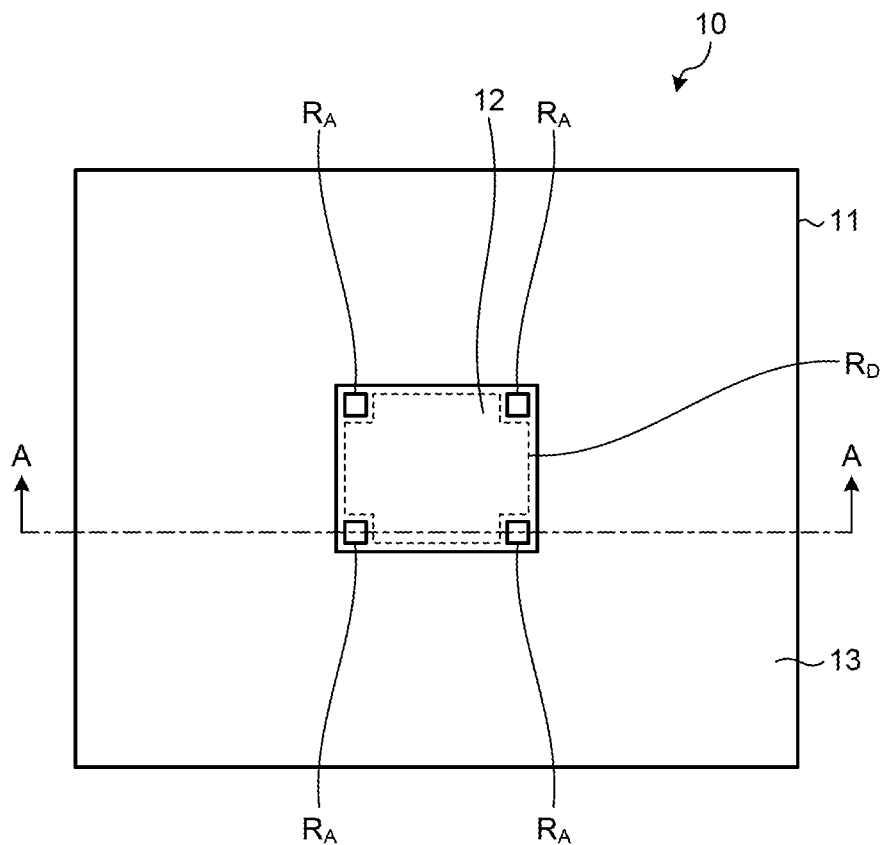
FIG. 1 is a top view illustrating an example of the structure of a template.
Figure 2:
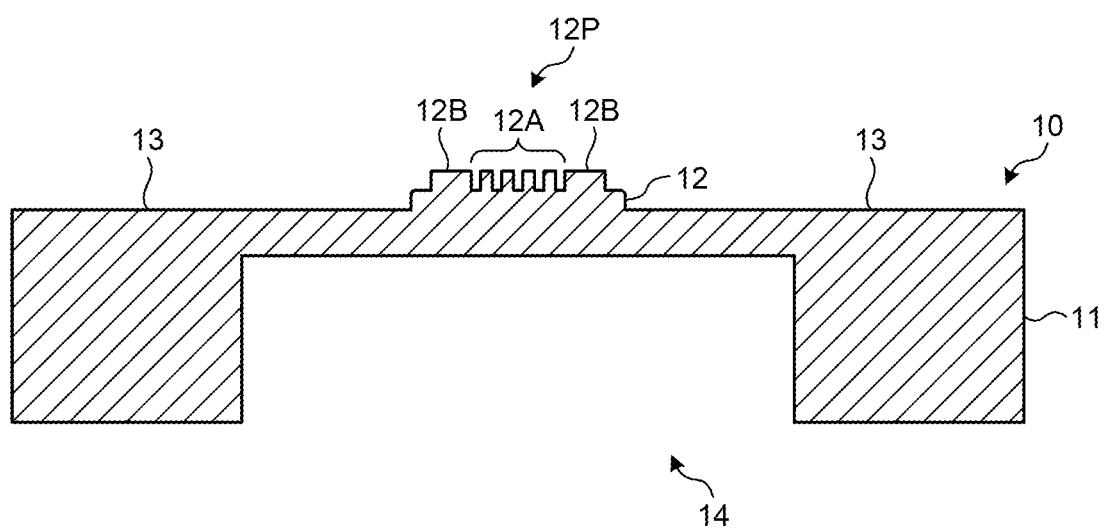
FIG. 2 is a sectional view of the template taken along a line A-A of FIG. 1.
Figure 3:
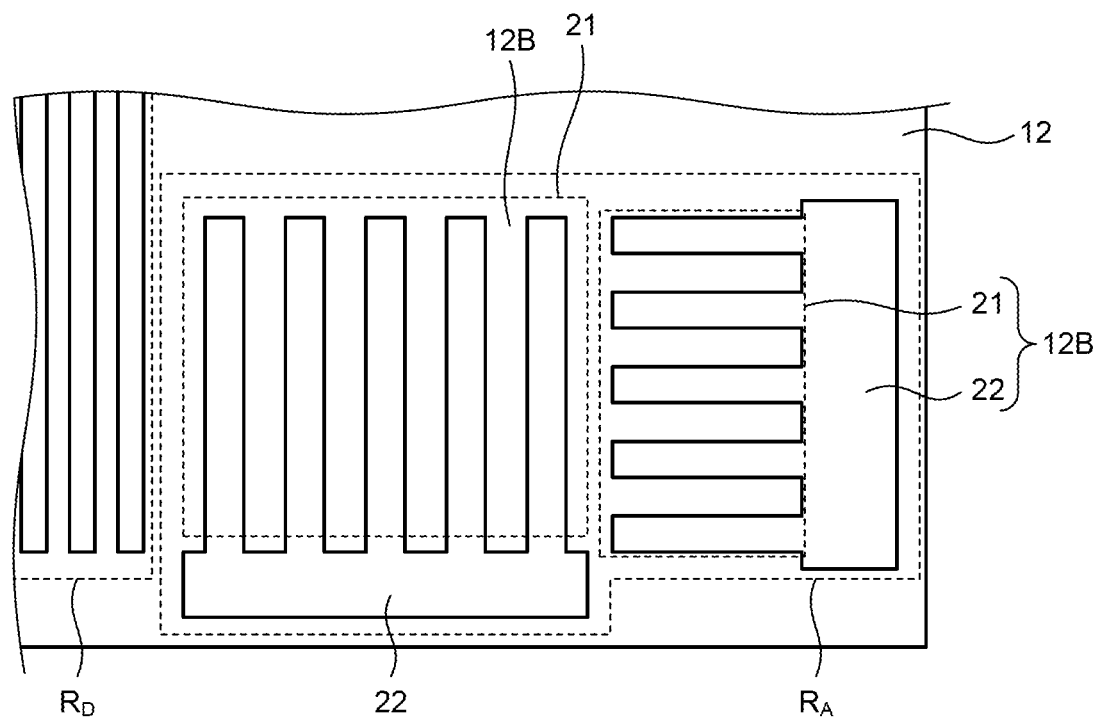
FIG. 3 is a partial top view illustrating an example of a region including alignment marks on the template.

First, an explanation will be given of a first embodiment. FIG. 1 is a top view illustrating an example of the structure of a template. FIG. 2 is a sectional view of the template taken along a line A-A of FIG. 1. FIG. 3 is a partial top view illustrating an example of a region including alignment marks on the template;

The template 10 is prepared by processing a rectangular template substrate 11. For example, the template substrate 11 is made of a material that transmits ultraviolet rays, such as quartz.

As illustrated in FIG. 1, the template substrate 11 includes a mesa part 12 and an off-mesa part 13 on the upper face. The mesa part 12 is located at and near the center and is provided with an uneven pattern 12P corresponding to device patterns 12A and alignment marks 12B. The off-mesa part 13 is formed of a region other than the mesa part 12.

The mesa part 12 has a mesa structure projected with respect to the off-mesa part 13. The mesa part 12 is configured to be set in contact with a resist on a substrate (not illustrated) during an imprint process. Further, as illustrated in FIG. 2, the template substrate 11 includes a recessed part (bore) 14 formed in the lower face. The recessed part 14 is arranged to include a region corresponding to the mesa part 12 that is on the upper face.

The mesa part 12 includes a device pattern arrangement region $R_D$, in which device patterns 12A for forming device patterns on the substrate are arranged, and alignment mark arrangement regions $R_A$, in which alignment marks 12B for performing positional alignment with respect to the substrate are arranged.

The device patterns 12A arranged in the device pattern arrangement region $R_D$ include, for example, line and space patterns or the like, in which extending recessed patterns are arranged at predetermined intervals in a direction intersecting with the extending direction.

The alignment mark arrangement regions $R_A$ are arranged, for example, near the corners (four corners) of the mesa part 12. Each of the alignment marks 12B includes a diffraction grating pattern 21 to be used for performing positional alignment with respect to the substrate, and an additional pattern 22 disposed in contact with the diffraction grating pattern 21. In the example of FIG. 3, two alignment marks 12B are arranged in each of the alignment mark arrangement regions $R_A$, such that the extending directions of their diffraction grating patterns 21 are orthogonal to each other.

Figure 4:
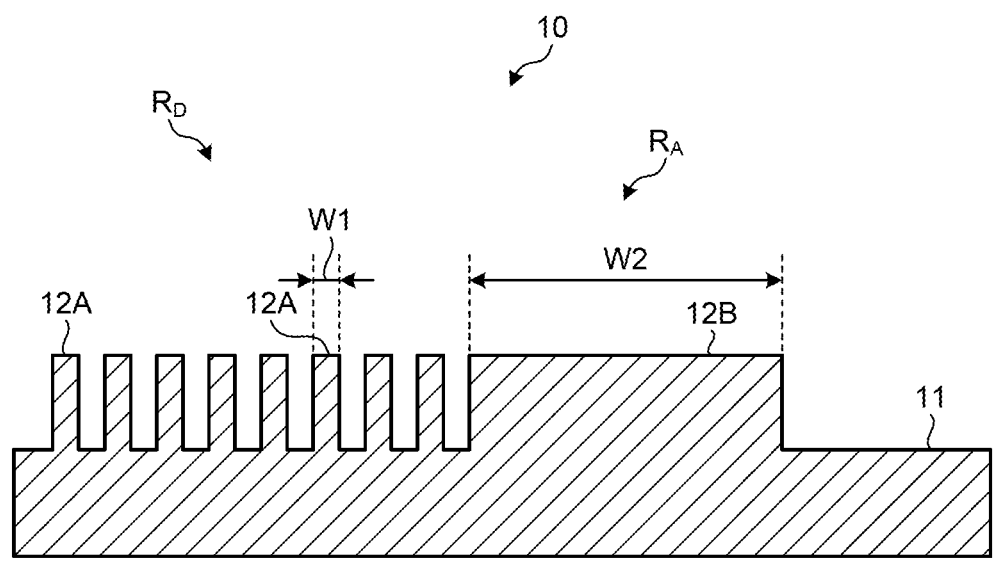
FIG. 4 is a schematic diagram illustrating an enlarged cross section of part of a template according to a first embodiment.

FIG. 4 is a schematic diagram illustrating an enlarged cross section of part of a template according to the first embodiment.

For the sake of easy understanding, FIG. 4 illustrates respective portions in a simplified state.

As described above, the template 10 includes the device pattern arrangement region $R_D$, in which the device patterns 12A are formed, and the alignment mark arrangement regions $R_A$, in which the alignment marks are formed.

In the device pattern arrangement region $R_D$, the device patterns 12A each having a width W1 are arranged in a periodically repeated format.

On the other hand, in each of the alignment mark arrangement regions $R_A$, the alignment marks 12B each having an arbitrary width W2 (>W1) are arranged.

Next, an explanation will be given of a method of manufacturing the template 10 according to the first embodiment.

FIG. 5 is a flowchart of a template manufacturing process.

FIGS. 6A to 6D are explanatory diagrams (part 1) of a template manufacturing process.

Figure 6A:
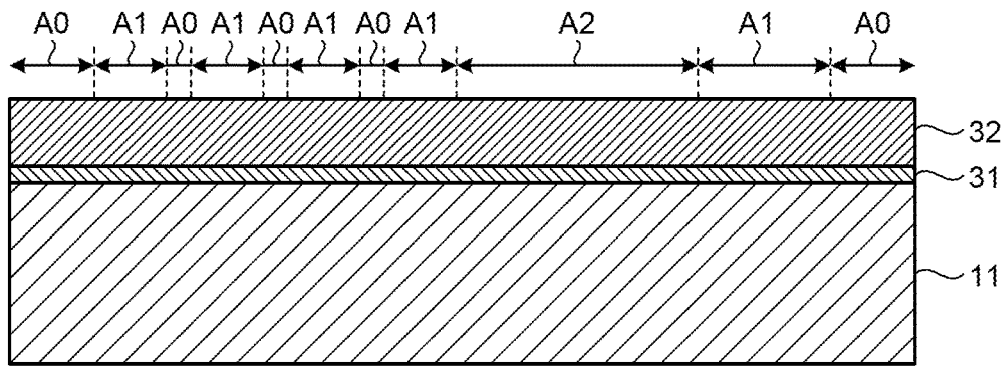
FIGS. 6A to 6D are explanatory diagrams (part 1) of a template manufacturing process.

First, as illustrated in FIG. 6A, a chromium (Cr) film 31 serving as an electroconductive film is formed on a template substrate 11 made of quartz. Further, a positive electron beam resist 32 is applied onto the chromium film (step S11).

Figure 6B:
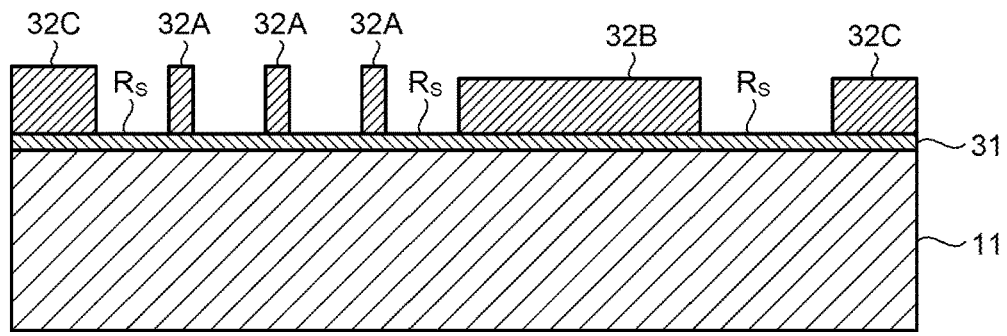

Then, core material patterns are drawn by an electron beam lithography device (not illustrated), and subjected to a development process, to form resist patterns 32A, 32B, and 32C as the core material patterns (step S12), as illustrated in FIG. 6B.

The resist patterns 32A are resist patterns corresponding to the device patterns 12A. Further, the resist patterns 32B are resist patterns corresponding to the alignment marks 12B. Further, the resist patterns 32C are resist patterns formed in a non-use region positioned around the core material patterns.

In this case, as illustrated in FIG. 6A, the surface region of the electron beam resist 32 is divided into areas of three types, which include areas A0 not to be irradiated with any electron beams, areas A1 to be irradiated with a first predetermined quantity of electron beams, and areas A2 to be irradiated with a second predetermined quantity of electron beams larger than the first predetermined quantity.

In this case, the formation areas of the resist patterns 32A in the device pattern arrangement region $R_D$ and the formation areas of the resist patterns 32C at the periphery are set different from the formation areas of the resist patterns 32B in the alignment mark arrangement regions $R_A$, in terms of the electron beam irradiation amount (effectively, the electron dose amount), and thereby set different in terms of the plasma resistance.

Specifically, the resist patterns 32B in the alignment mark arrangement regions $R_A$ are set higher in plasma resistance, and the resist patterns 32A and 32C are set lower in plasma resistance as compared with the resist patterns 32B.

More specifically, the formation areas of the resist patterns 32A in the device pattern arrangement region $R_D$ and the formation areas of the resist patterns 32C at the periphery have been irradiated with electron beams at about 100 $\mu C/cm^2$, and the formation areas of the resist patterns 32B in the alignment mark arrangement regions $R_A$ have been irradiated with electron beams at about several $mC/cm^2$.

Figure 6C:
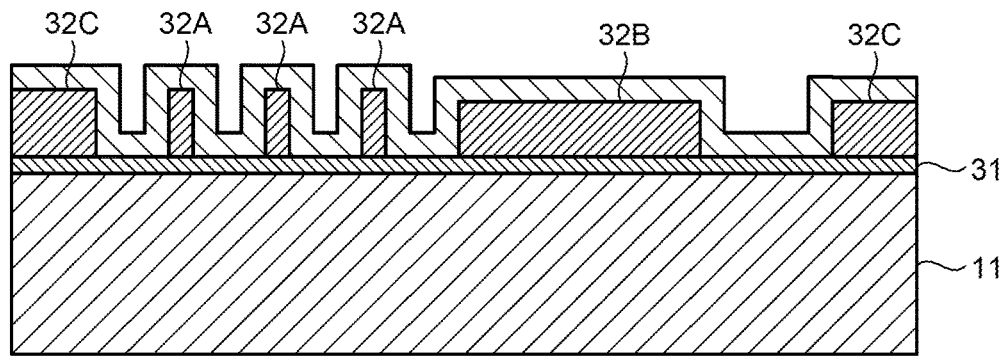

Then, as illustrated in FIG. 6C, a coating film 35 is formed to cover the side surfaces and upper surfaces of the resist patterns 32A, 32B, and 32C, and the upper surface of the chromium film 31 (step S13), by an Atomic Layer Deposition (ALD) method, which is one of the low-temperature vacuum film forming methods.

The reason for using the ALD method resides in that the coating film 35 can be formed to have a uniform film thickness at a low temperature with good controllability without damaging the resist patterns 32A, 32B, and 32C, and to achieve high coverage.

Accordingly, the coating film 35 is preferably made of a material that allows the film formation to be performed at a low temperature without damaging the resist patterns 32A, 32B, and 32C, and can attain a high etching selectivity with respect to the chromium film 31 in etching on the chromium film 31. Specifically, the material is exemplified by silicon-based materials, such as silicon oxide ($SiO_2$) and silicon nitride (SiN), aluminum-based materials, such as alumina ($Al_2O_3$), hafnium-based materials, such as hafnium oxide (HfO), and the like. Further, basically, the film thickness of the coating film is preferably set to a film thickness corresponding to a half pitch of the design of target patterns.

The resist patterns 32A and 32B serve as the core material (core) in forming the coating film.

Figure 6D:
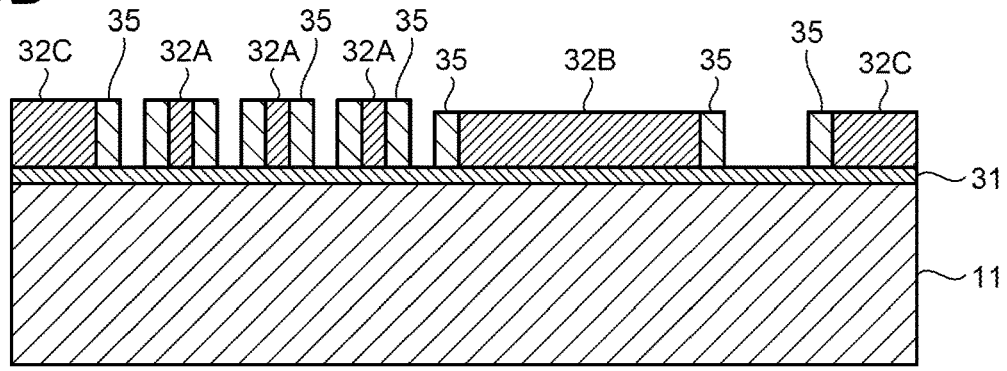

Then, as illustrated in FIG. 6D, the coating film is etched back to expose the resist patterns and the chromium film (step S14). At this time, portions of the coating film 35 are left on the side surfaces of the resist patterns as a sidewall mask.

In this embodiment, as described above, the coating film 35 is etched back to expose the upper surfaces of the resist patterns 32A, 32B, and 32C, and thus the resist patterns are in an easily removable state. Then, when the resist patterns are removed, patterns of the coating film 35 are formed.

FIGS. 7A to 7D are explanatory diagrams (part 2) of the template manufacturing process.

The resist core material is removed by drying or wetting (step S15).

Figure 7A:
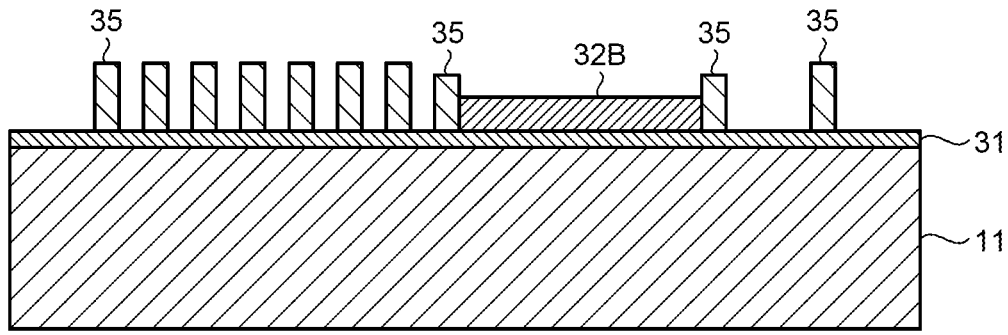
FIGS. 7A to 7D are explanatory diagrams (part 2) of the template manufacturing process.

In this case, in step S2, in the alignment mark arrangement regions $R_A$ higher in plasma resistance, the resist core material remains sufficiently, as illustrated in FIG. 7A while in the device pattern arrangement region $R_D$ lower in plasma resistance, the resist core material is completely removed.

Figure 7B:
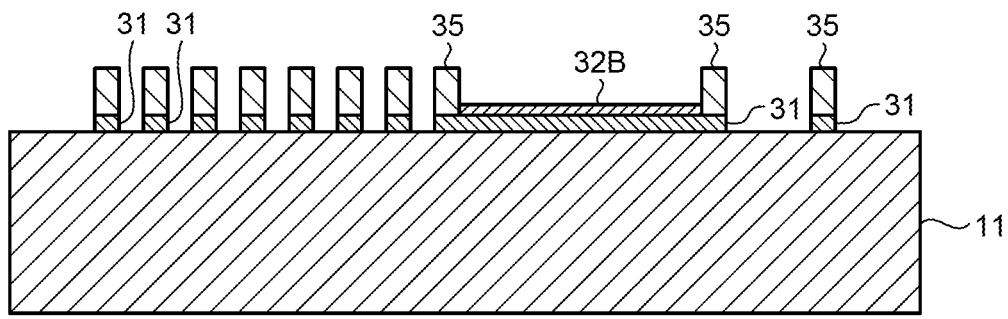

Then, in step S15, the exposed chromium film 31 serving as an electroconductive film are removed by plasma etching (step S16), as illustrated in FIG. 7B. The exposed chromium film 31 correspond to space pattern regions $R_S$, which are pattern non-formation areas where the coating film 35 and the resist patterns 32A of the resist core material have been completely removed.

Figure 7C:
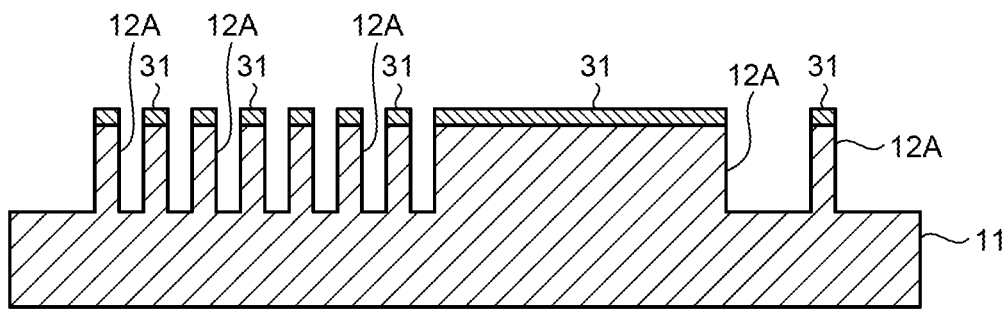

Then, as illustrated in FIG. 7C, the substrate 11 is etched by using, as a mask, all the remaining portions of the coating film 35 and the remaining resist patterns 32B, to process the substrate so as to form device patterns 12A and alignment marks 12B on the substrate (step 17). All the remaining portions of the coating film 35 and the remaining resist patterns 32B are removed.

Figure 7D:
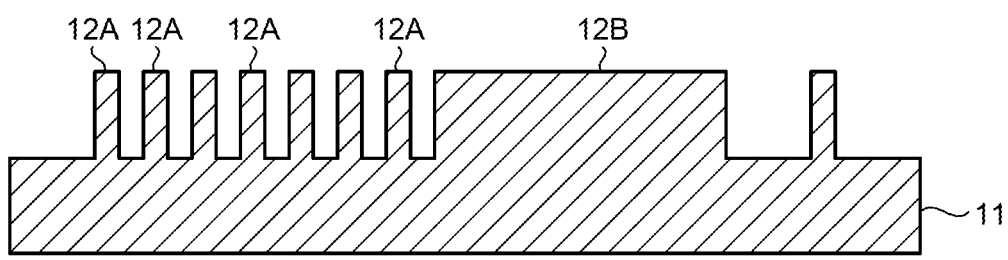

Then, the remaining portions of the chromium film 31 serving as an electroconductive film are removed (step S18). Consequently, as illustrated in FIG. 7D, the light transmitting template substrate 11 is given an uneven pattern formed thereon that corresponds to the device patterns 12A and the alignment marks 12B, so that a template 10 for nanoimprint is obtained.

As a method for removing the electroconductive film, either a wet etching method or a dry etching method is used. However, when the electroconductive film is the chromium film 31 as in this embodiment, the film can be easily removed by wet etching with an aqueous solution of Ceric Ammonium Nitrate (CAN).

Thereafter, wet cleaning with water is performed, and the template 10 is thereby ready for actual use.

In this case, the water used for the wet cleaning is exemplified by pure water, ozone water, and functional water that does not adversely affect the template 10. The water to be used may be heated to the extent that the template 10 is not affected by damage or the like. Further, physical cleaning means, such as ultrasonic waves, may be additionally used to the extent that the metal thin film patterns and/or the light transmitting substrate are not affected by damage or the like.

As described above, according to the first embodiment, it is possible to form the device patterns and the alignment marks, which are different in pattern width, in the same process. Further, according to the first embodiment, it is possible to form each of the alignment marks with an arbitrary size.

Thus, it is possible to manufacture a template that exerts sufficient alignment signal intensity without subdivisions of the alignment marks.

As described above, in order to obtain a difference in processing resistance (plasma resistance), the electron beam irradiation amount (energy beam irradiation dose amount) is set different by using the electron beam lithography device. However, in place of the electron beam lithography device, an ion implantation device or electron beam irradiation device may be provided to perform ion implantation or electron beam irradiation. In this case, the ion implantation amount or electron beam irradiation amount is adjusted in these steps, such that the core material non-formation areas including no core material patterns, the first core material patterns, and the second core material patterns are set in a state where the latter is higher in etching resistance than the former in this order.

Second Embodiment

The first embodiment described above relates to a case where the alignment marks 12B having an arbitrary size are formed. On the other hand, the second embodiment is an embodiment where alignment marks 12B are formed which have a pattern width of twice or less the pattern width of the resist patterns 32A (pattern width W1 in the first embodiment).

Here, in the accompanying drawings directed to the second embodiment, the constituent elements substantially the same as those of the first embodiment are denoted by the same reference symbols as those of the first embodiment.

Figure 8:
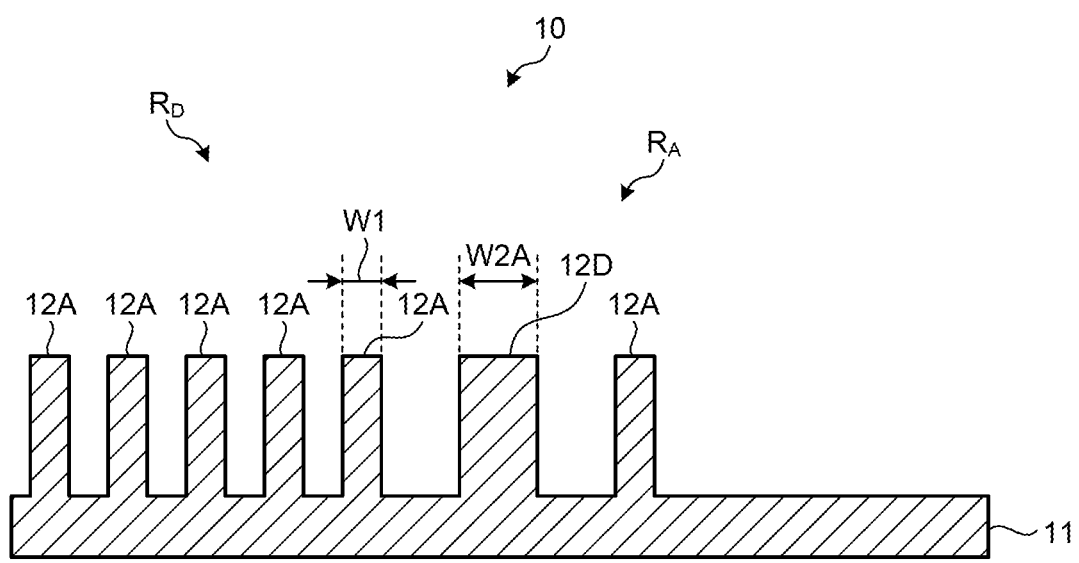
FIG. 8 is a schematic diagram illustrating an enlarged cross section of part of a template according to a second embodiment.

FIG. 8 is a schematic diagram illustrating an enlarged cross section of part of a template according to a second embodiment.

As in the case of FIG. 4, for the sake of easy understanding, FIG. 8 also illustrates respective portions in a simplified state.

As described above, the template 10 includes a device pattern arrangement region $R_D$, in which device patterns 12A are formed, and alignment mark arrangement regions $R_A$, in which alignment marks are formed.

In the device pattern arrangement region $R_D$, the device patterns 12A each having a width W1 are arranged in a periodically repeated format.

On the other hand, in each of the alignment mark arrangement regions $R_A$, the alignment marks 12B each having a width W2A of twice or less the width W1 ($2 \cdot W1 \geq W2A > W1$) are arranged.

Next, an explanation will be given of a method of manufacturing the template 10 according to the second embodiment.

In the following description, an explanation will be given with reference to FIG. 5 of the first embodiment again.

FIGS. 9A to 9D are explanatory diagrams (part 1) of a template manufacturing process.

Figure 9A:
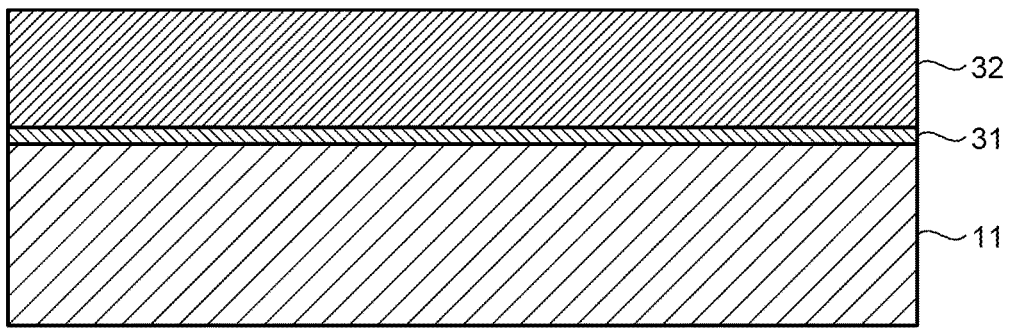
FIGS. 9A to 9D are explanatory diagrams (part 1) of a template manufacturing process.

First, as illustrated in FIG. 9A, a chromium (Cr) film 31 serving as an electroconductive film is formed on a template substrate 11 made of quartz (step S11).

Figure 9B:
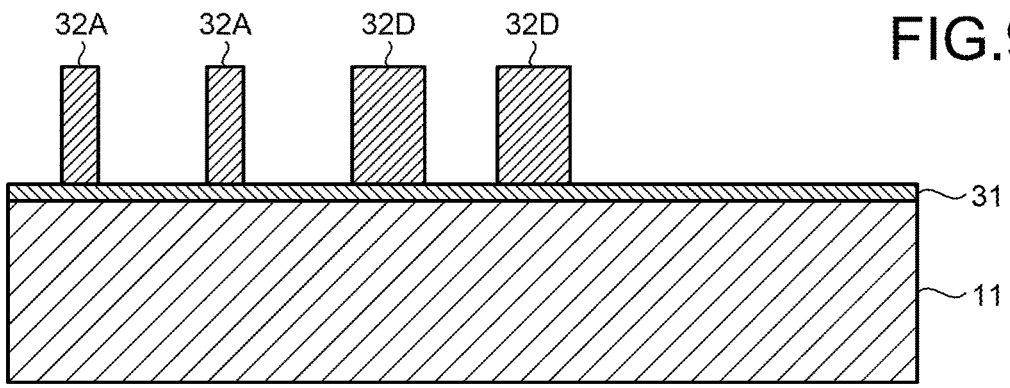

Then, a positive electron beam resist is applied onto the chromium film 31 on the template substrate 11. Further, drawing of core material patterns is performed by an electron beam lithography device (not illustrated), and a development process is performed thereafter, so that, as illustrated in FIG. 9B, resist patterns 32A and 32D are formed as the core material patterns (step S12).

Here, the resist patterns 32A are resist patterns corresponding to the device patterns 12A. Further, the resist patterns 32D are resist patterns corresponding to the alignment marks 12B.

Further, the separation distance between a pair of resist patterns 32D arranged at opposing positions is set to be twice or less the coating thickness of a coating film 35 described later. Further, the separation distance between the pair of resist patterns 32D corresponds to the thickness of the width W2A of one alignment mark 12B to be formed.

Figure 9C:
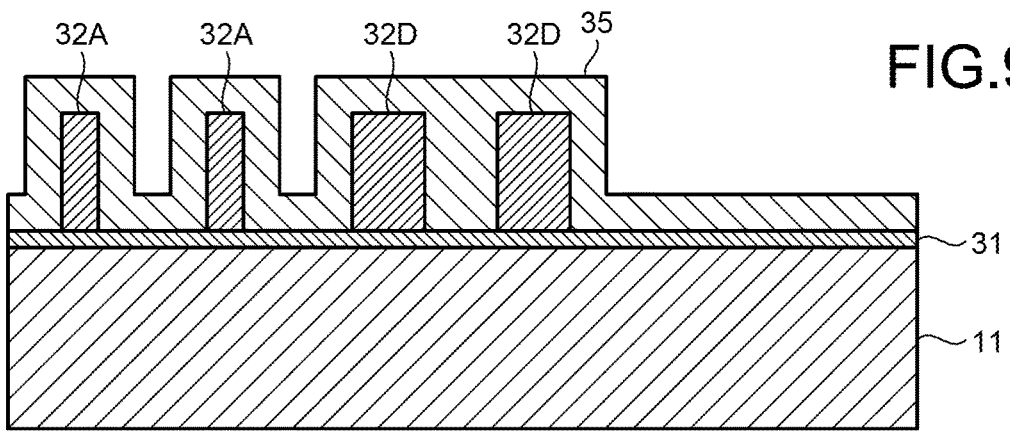

Then, as illustrated in FIG. 9C, the coating film 35 is formed to cover the side surfaces and upper surfaces of the resist patterns 32A and 32D, and the upper surface of the chromium film 31 (step S13), by an Atomic Layer Deposition (ALD) method, which is one of the low-temperature vacuum film forming methods.

In this case, as the separation distance of the pair of resist patterns 32D is set to be twice or less the coating thickness of the coating film 35, the space between the pair of resist patterns 32D comes to be filled with the coating film 35.

On the other hand, the resist patterns are formed such that each of the separation distance between a pair of resist patterns 32A and the separation distance between the resist patterns 32A and 32D is set to be twice or more the coating thickness of the coating film 35. Thus, the space between the pair of resist patterns 32A and the space between the resist patterns 32A and 32D do not come to be completely filled with the coating film 35.

Here, the resist patterns 32A and 32D serve as the core material (core) in forming the coating film.

Figure 9D:
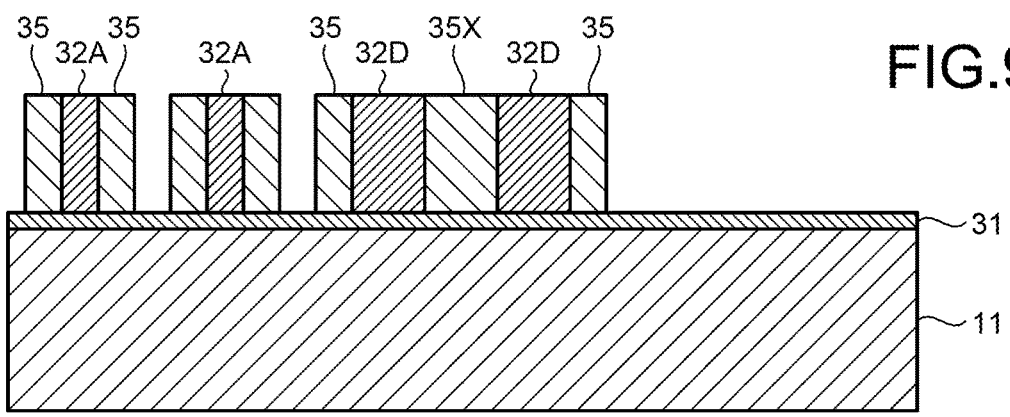

Then, as illustrated in FIG. 9D, the coating film is etched back to expose the resist patterns and the chromium film (step S14). At this time, portions of the coating film are left on the side surfaces of the resist patterns as a sidewall mask.

In the second embodiment, as described above, the coating film 35 is etched back to expose the upper surfaces of the resist patterns 32A and 32D, and thus the resist patterns are in a easily removable state.

FIGS. 10A to 10D are explanatory diagrams (part 2) of the template manufacturing process.

Figure 10A:
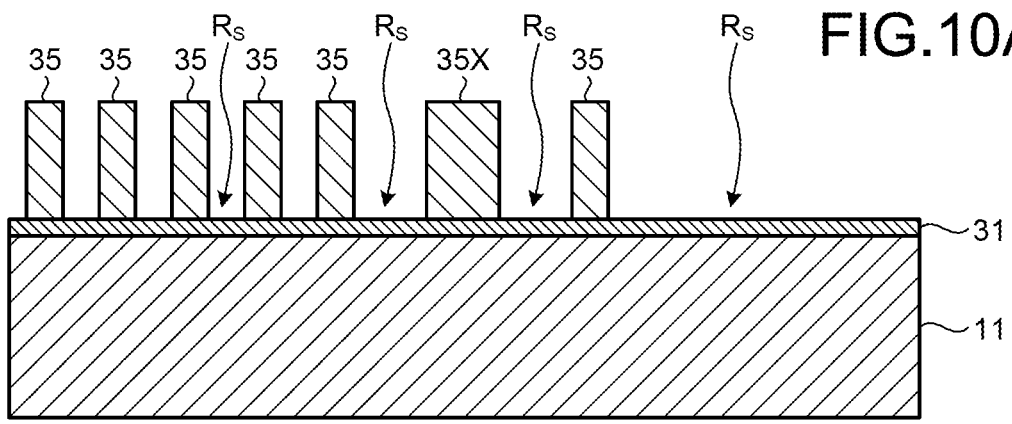
FIGS. 10A to 10D are explanatory diagrams (part 2) of the template manufacturing process.

Then, as illustrated in FIG. 10A, the resist core material is removed by a dry process or wet process (step S15). Consequently, coating film patterns 35 and 35X different in pattern width are formed.

Figure 10B:
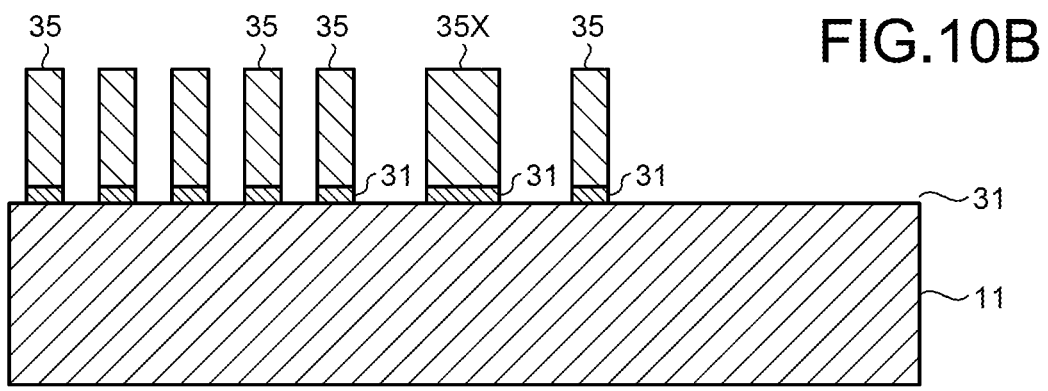

Then, in the processing of step S15, the exposed portions of the chromium film 31 serving as an electroconductive film are removed by plasma etching (step S16), as illustrated in FIG. 10B. Here, these portions of the chromium film 31 correspond to space pattern regions $R_S$, which are pattern non-formation areas where the coating film patterns 35 and 35X and the resist patterns 32A and 32D of the resist core material have been completely removed.

Figure 10C:
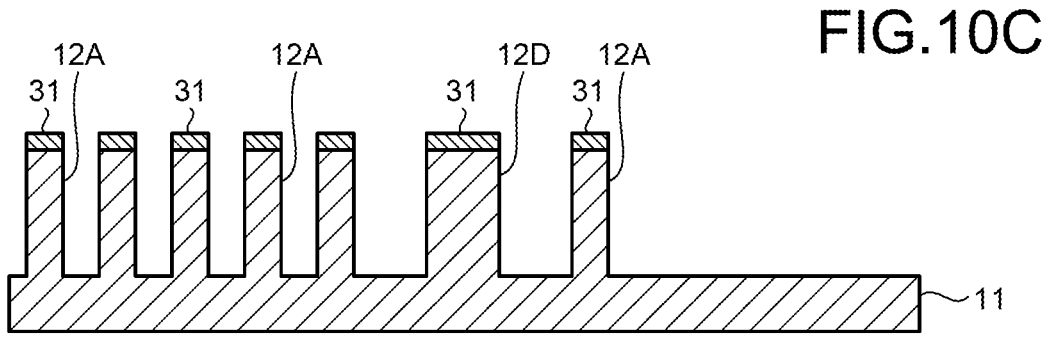

Then, as illustrated in FIG. 10C, the substrate 11 is etched by using, as a mask, all the coating film patterns 35 and 35X and the remaining portions of the chromium film 31, to process the substrate so as to form device patterns 12A and alignment marks 12D on the substrate (step 17). Here, all the coating film patterns 35 and 35X are removed.

Figure 10D:
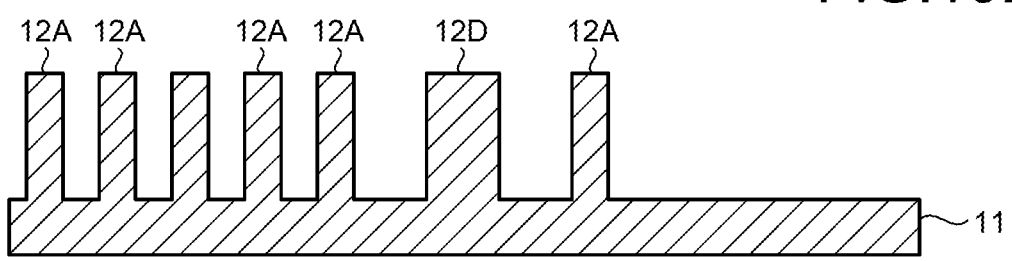

Then, the remaining portions of the chromium film 31 serving as an electroconductive film are removed (step S18). Consequently, as illustrated in FIG. 10D, the light transmitting template substrate 11 is given an uneven pattern formed thereon that corresponds to the device patterns 12A and the alignment marks 12D, so that a template 10 for nanoimprint is obtained.

As described above, according to the second embodiment, it is also possible to form the device patterns and the alignment marks different in pattern width through the same process. Further, it is possible to manufacture a template that can obtain the alignment signal intensity sufficiently, without subdivisions of the alignment marks.

It should be noted that the second embodiment may be applied to the first embodiment. In this case, in the steps of FIGS. 6B and 6C of the first embodiment, an additional resist pattern may be provided between the resist patterns 32A and 32B such that the space between the additional resist pattern and the resist patterns 32B is set to be completely filled with the coating film 35. In other words, the separation distance between the additional resist pattern and the resist patterns 32B is set to be twice or less the coating thickness of the coating film 35.

Example of Imprint Process

Next, an explanation will be given of a specific example of an imprint process.

Figure 11:
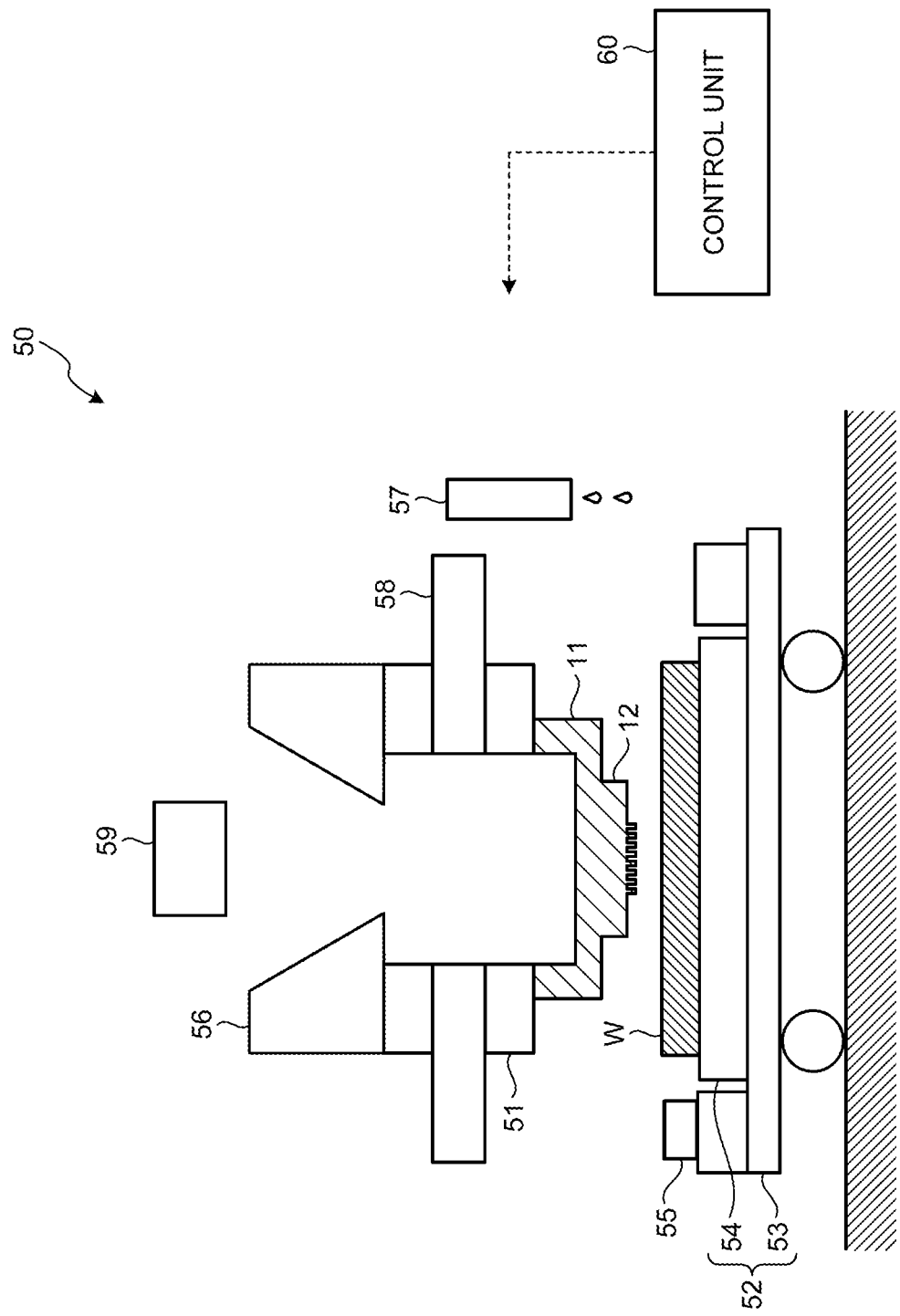
FIG. 11 is a diagram illustrating a configuration example of an imprint device 50 according to an embodiment.

FIG. 11 is a diagram illustrating a configuration example of an imprint device 50 according to an embodiment.

As illustrated in FIG. 11, the imprint device 50 includes a template stage 51, a mount 52 including a main body 53 and a wafer chuck 54, a reference mark 55, an alignment sensor 56, a liquid dropping device 57, a stage base 58, a light source 59, and a control unit 60.

A template 10 is attached to or installed in the imprint device 50.

The mount 52 includes the wafer chuck 54 and the main body 53. The wafer chuck 54 is configured to secure a wafer W serving as a transfer destination, at a predetermined position on the main body 53. The mount 52 is provided with the reference mark 55 thereon. The reference mark 55 is used for positional alignment when the wafer W is loaded onto the mount 52.

The mount 52 mounts the wafer W thereon and is moved in a plane (horizontal plane) parallel to the wafer W mounted thereon. When a resist is to be dropped on the wafer W, the mount 52 is moved to place the wafer W below the liquid dropping device 57. When transfer processing is to be performed on the wafer W, the mount 52 is moved to place the wafer W below the template 10.

The stage base 58 supports the template 10 by the template stage 51, and is moved upward and downward (in the vertical direction) to press the fine pattern 13 of the template 10 to a resist on the wafer W. The stage base 58 is provided with the alignment sensor 56 thereon. The alignment sensor 56 is a sensor for detecting the position of the wafer W and for detecting the positions of the alignment marks 12B (see FIG. 1) of the template 10.

The liquid dropping device 57 is a device of an ink-jet type for dropping a resist onto the wafer W. The liquid dropping device 57 includes an ink-jet head formed with a plurality of fine holes for ejecting resist droplets to drop the resist droplets onto the wafer W.

The light source 59 is a device for performing irradiation with, for example, ultraviolet rays and is disposed above the stage base 58. The light source 59 irradiates the template 10 with light from above, under a state where the template 10 is pressed to the resist.

The control unit 60 controls the template stage 51, the mount 52, the reference mark 55, the alignment sensor 56, the liquid dropping device 57, the stage base 58, and the light source 59.

FIGS. 12A to 12E are diagrams illustrating an example of the flow of procedures of an imprint process using the template 10, according to an embodiment.

A wafer W with an intended film Ox formed thereon is placed on the mount 52, and the mount 52 is move to a position below the liquid dropping device 57.

Figure 12A:
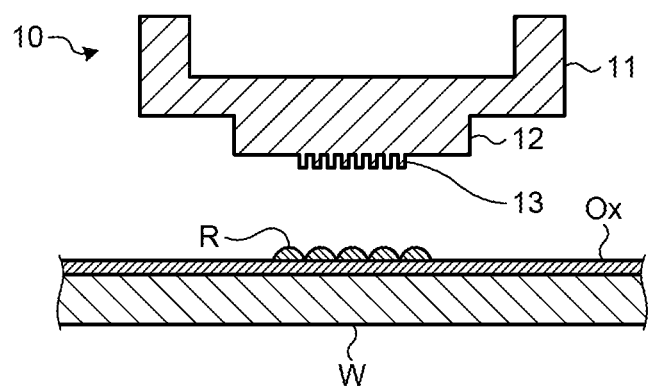
FIGS. 12A to 12E are diagrams illustrating an example of the flow of procedures of an imprint process using a template 10, according to an embodiment.

As illustrated in FIG. 12A, the liquid dropping device 57 is used to drop droplets of the resist R onto the film Ox. Thereafter, the mount 52 is moved to a position below the template 10.

Figure 12B:
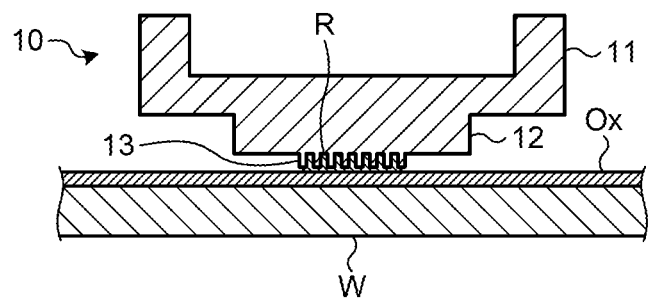

As illustrated in FIG. 12B, while the alignment sensor 56 is used to detect the alignment marks 12B (see FIG. 1) for positional alignment, the template stage 51 is moved down to press the mesa part 12 of the template 10 to the resist R. Then, under a state where the template 10 is pressed, the light source 59 of the imprint device 50 is used to irradiate the resist R with light to cure the resist R.

Figure 12C:
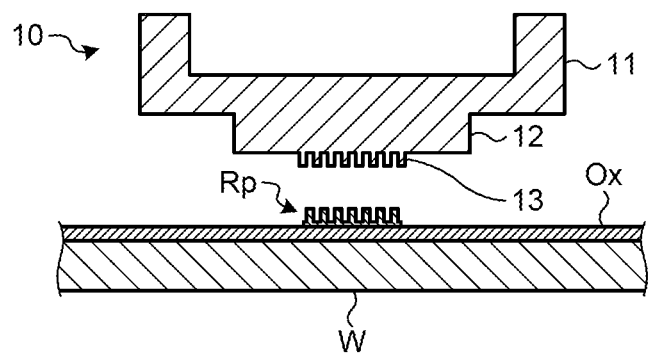

As illustrated in FIG. 12C, the template 10 is separated from the resist R. Consequently, the film Ox on the wafer W is given a resist pattern Rp formed by transfer from the uneven pattern 12P of the mesa part 12.

Figure 12D:
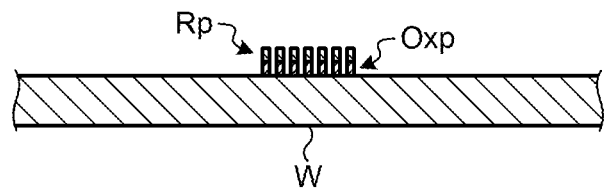

As illustrated in FIG. 12D, the film Ox is processed by using, as a mask, the resist pattern Rp formed by transfer from the uneven pattern 12P of the mesa part 12. Consequently, the film pattern Oxp is formed.

Figure 12E:
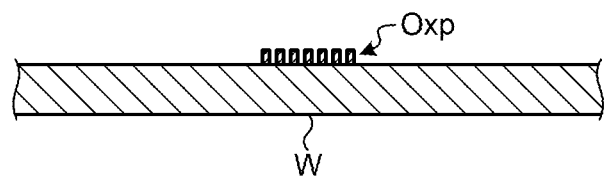

As illustrated in FIG. 12E, the resist pattern Rp is peeled by asking, and the film pattern Oxp formed on the wafer W is thereby obtained.

Thereafter, the processing as described above is repeatedly performed to form a plurality of film patterns on the wafer W, so that a semiconductor device is manufactured.

Here, the imprint device 50 according to this embodiment is configured to drop the resist R. However, alternatively, a spin coating method may be used to apply a resist entirely over the wafer W.

Additional embodiments are described below.

(1) A pattern forming method according to an embodiment includes forming a resist film including a first core material pattern and a second core material pattern, on a first film laminated on a substrate; forming a second film at least on sidewalls of the first and second core material patterns; removing the first core material pattern, while not removing the second core material pattern and the second film; and processing the first film by using, as a mask, the second core material pattern and the second film.

(2) In the pattern forming method according to (1), the second core material pattern is higher in processing resistance than the first core material pattern.

(3) In the pattern forming method according to (1) or (2), the first and second core material patterns are formed by changing an energy beam irradiation amount to the resist film.

(4) In the pattern forming method according to (1) or (2), the first and second core material patterns are formed by changing an ion implantation amount to the resist film.

(5) The pattern forming method according to any one of (1) to (4) further includes irradiating the second core material pattern with energy beams after forming the second film.

(6) In the pattern forming method according to any one of (1) to (4), the second core material pattern is formed in an alignment mark arrangement region.

(7) A template manufacturing method includes applying an electron beam resist onto a first film laminated on a template substrate; forming a resist film including a first core material pattern and a second core material pattern; forming a second film at least on sidewalls of the first core material pattern and the second core material pattern; removing the first core material pattern, while not removing the second core material pattern and the second film; processing the first film by using, as a mask, the second core material pattern and the second film; and processing the template substrate by using the processed first film.

(8) In the template manufacturing method according to (7), the second core material pattern is higher in processing resistance than the first core material pattern.

(9) In the template manufacturing method according to (7) or (8), the first and second core material patterns are formed by changing an energy beam irradiation amount to the resist film.

(10) In the template manufacturing method according to (7) or (8), the first and second core material patterns are formed by changing an ion implantation amount to the resist film.

(11) The template manufacturing method according to any one of (7) to (10) further includes irradiating the second core material pattern with energy beams, after the forming a second film.

(12) In the template manufacturing method according to any one of (7) to (10), the second core material pattern is formed in an alignment mark arrangement region.

(13) A pattern forming method according to an embodiment includes forming a resist film including a first core material pattern and a second core material pattern, on a first film laminated on a substrate; forming a second film at least on sidewalls of the first and second core material patterns; removing the first and second core material patterns, while not removing the second film; and processing the first film by using the second film as a mask. The forming the second film includes filling a space between the first core material pattern and the second core material pattern with the second film.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A pattern forming method comprising:
    forming a first resist film including a first region and a second region, on a first film provided on a substrate;
    irradiating the first region and the second region of the first resist film with different amounts of energy beam or ion to form a second resist film including a first pattern and a second pattern;
    forming a second film at least on sidewalls of the first and second patterns;
    removing the first pattern while not removing the second pattern and the second film; and
    processing the first film by using the second pattern and the second film as a mask.

2. The pattern forming method according to claim 1, wherein
    the second pattern is higher in processing resistance than the first pattern.

3. The pattern forming method according to claim 1, wherein
    the second pattern is formed in the second region, and
    an energy beam irradiation amount to the second region is larger than an energy beam irradiation amount to the first region.

4. The pattern forming method according to claim 1, wherein
    the second pattern is formed in the second region, and
    an ion implantation amount to the second region is larger than an ion implantation amount to the first region.

5. The pattern forming method according to claim 1, further comprising
    irradiating the second pattern with energy beams after forming the second film.

6. The pattern forming method according to claim 1, wherein
    the second pattern is formed in an alignment mark arrangement region.

7. The pattern forming method according to claim 1, wherein
    in a direction orthogonal to the substrate, the second pattern is smaller in thickness than the first pattern.

8. A template manufacturing method comprising:
    applying an electron beam resist onto a first film provided on a template substrate;
    forming a resist film including a first pattern and a second pattern;
    forming a second film at least on sidewalls of the first pattern and the second pattern;
    removing the first pattern while not removing the second pattern and the second film;
    processing the first film by using the second pattern and the second film as a mask; and
    processing the template substrate by using the processed first film as a mask.

9. The template manufacturing method according to claim 8, further comprising
    forming the second pattern such that the second pattern exerts a higher processing resistance than the first pattern.

10. The template manufacturing method according to claim 9, wherein
    the forming the second pattern comprises changing the energy beam irradiation amount to the resist film.

11. The template manufacturing method according to claim 9, wherein
    the forming the second pattern comprises changing the ion implantation amount to the resist film.

12. The template manufacturing method according to claim 9, further comprising
    irradiating the second pattern with energy beams after forming the second film.

13. A pattern forming method comprising:
- forming a resist film including a first pattern and a second pattern, on a first film provided on a substrate;
- forming a second film at least on sidewalls of the first and second patterns;
- removing the first and second patterns, while not removing the second film; and
- processing the first film by using the second film as a mask, wherein
- the forming the second film comprising filling a space between the first pattern and the second pattern with the second film.

14. The pattern forming method according to claim 13, wherein
- a distance between the first pattern and the second pattern is twice or less the thickness of the second film.

\* \* \* \* \*